(12) United States Patent
Hu et al.

(10) Patent No.: US 11,530,874 B2
(45) Date of Patent: Dec. 20, 2022

(54) DRY BOX AND CONTROL METHOD THEREOF, AND PREPARATION METHOD OF ORGANIC ELECTROLUMINESCENT DEVICE

(71) Applicant: BOE TECHNOLOGY GROUP CO., LTD., Beijing (CN)

(72) Inventors: Chunjing Hu, Beijing (CN); Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 284 days.

(21) Appl. No.: 16/651,567

(22) PCT Filed: Apr. 3, 2019

(86) PCT No.: PCT/CN2019/081305
§ 371 (c)(1),
(2) Date: Mar. 27, 2020

(87) PCT Pub. No.: WO2019/237802
PCT Pub. Date: Dec. 19, 2019

(65) Prior Publication Data
US 2020/0263924 A1 Aug. 20, 2020

(30) Foreign Application Priority Data
Jun. 14, 2018 (CN) .......................... 201810613551.3

(51) Int. Cl.
*F26B 23/04* (2006.01)
*H01L 51/56* (2006.01)
(52) U.S. Cl.
CPC .............. *F26B 23/04* (2013.01); *H01L 51/56* (2013.01)

(58) Field of Classification Search
CPC .................................. F26B 23/04; H01L 51/56
USPC ........................................................... 34/523
See application file for complete search history.

(56) References Cited

U.S. PATENT DOCUMENTS

| 5,226,242 | A  | * | 7/1993 | Schwenkler | ...... H01L 21/67034 |
|           |    |   |        |            | 34/493 |
| 7,363,729 | B2 | * | 4/2008 | Tanaka     | ...................... F26B 3/28 |
|           |    |   |        |            | 205/333 |
| 8,828,763 | B1 |   | 9/2014 | Lee et al. | |
| 9,698,308 | B2 | * | 7/2017 | Bower      | .................... G02F 1/167 |

(Continued)

FOREIGN PATENT DOCUMENTS

| CN | 103227187 A | 7/2013 |
| CN | 104051674 A | 9/2014 |

(Continued)

OTHER PUBLICATIONS

International Search Report of PCT/CN2019/081305 in Chinese, dated Jul. 5, 2019, with English translation.

*Primary Examiner* — Stephen M Gravini
(74) *Attorney, Agent, or Firm* — Collard & Roe, P.C.

(57) ABSTRACT

A dry box and a control method therefor, and a preparation method for an organic electroluminescent device are provided. The dry box includes a cavity and a hot plate arranged in the cavity. The hot plate includes a plurality of heating spots, the plurality of heating spots being arranged towards the hot plate to support a surface of a device to be dried, and some of the temperature of the plurality of heating spots being different and the heating spots being insulated from each other.

15 Claims, 6 Drawing Sheets

(56) References Cited

U.S. PATENT DOCUMENTS

| | | | |
|---|---|---|---|
| 9,814,331 B2* | 11/2017 | Alexander | A47J 36/2494 |
| 9,947,697 B2* | 4/2018 | Long | H01L 27/1255 |
| 10,240,867 B2* | 3/2019 | Zielinski | F26B 23/04 |
| 2013/0193418 A1 | 8/2013 | Ishikawa | |
| 2015/0097173 A1 | 4/2015 | Watanabe et al. | |
| 2017/0092860 A1 | 3/2017 | Jia et al. | |
| 2018/0123076 A1 | 5/2018 | Fukuda et al. | |
| 2020/0263924 A1* | 8/2020 | Hu | F26B 23/04 |
| 2021/0027691 A1* | 1/2021 | Hu | G09G 3/2003 |
| 2022/0013754 A1* | 1/2022 | Yasumoto | H01L 51/56 |

FOREIGN PATENT DOCUMENTS

| | | | |
|---|---|---|---|
| CN | 104518175 A | 4/2015 | |
| CN | 105132868 A | 12/2015 | |
| CN | 105428554 A | 3/2016 | |
| CN | 108011050 A | 5/2018 | |
| CN | 108091778 A | 5/2018 | |
| CN | 109059436 A | 12/2018 | |
| WO | WO-2019237802 A1 * | 12/2019 | F26B 23/04 |

* cited by examiner

DRY BOX AND CONTROL METHOD THEREOF, AND PREPARATION METHOD OF ORGANIC ELECTROLUMINESCENT DEVICE

CROSS REFERENCE TO RELATED APPLICATIONS

This application is the National Stage of PCT/CN2019/081305 filed on Apr. 3, 2019, which claims priority under 35 U.S.C. § 119 of Chinese Application No. 201810613551.3 filed on Jun. 14, 2018, the disclosure of which is incorporated by reference.

TECHNICAL FIELD

Embodiments of the present disclosure relate to a dry box, a control method thereof, and a preparation method of an organic electroluminescent device.

BACKGROUND

Due to its advantages of thinness, light weight, wide viewing angle, active light emission, continuously adjustable emitted colors, low cost, high color gamut, high contrast, fast response speed, low energy consumption, low drive voltage, wide operating temperature range, simple production process, high luminous efficiency, flexible display, or the like, an organic light-emitting diode device (OLED) has been listed as the promising next-generation display technology.

SUMMARY

Embodiments of the present disclosure provide a dry box, a control method thereof, and a preparation method of an organic electroluminescent device.

At least one embodiment provides a dry box, comprising a cavity and a hot plate provided in the cavity. The hot plate comprises a plurality of heating spots, the plurality of heating spots being arranged towards the hot plate to support a surface of a device to be dried, and some of the temperature of the plurality of heating spots being different and the heating spots being insulated from each other.

For example, the hot plate comprises a substrate and a plurality of independent heating sources provided on the substrate, the substrate being made of a heat insulating material.

For example, the heating spots are respectively top portions of the heating sources on the hot plate, or points or regions respectively corresponding to orthographic projections of the heating sources on the hot plate.

For example, shapes of the orthographic projections of the plurality of heating sources on the substrate are different.

For example, the dry box further comprises temperature controllers configured to adjust the temperatures of the heating sources, each of the temperature controllers being coupled to a corresponding heating source, or, the heating sources having a same shape of orthographic projections on the substrate being coupled to a same temperature controller.

For example, the dry box is configured to dry an organic electroluminescent device to be dried, and the plurality of heating sources on the substrate are divided into a plurality of groups, a cross-sectional shape of the plurality of the heating sources in each group perpendicular to a thickness direction of the substrate is the same as a shape of a pattern to be dried in a plurality of subpixels in each pixel unit of the organic electroluminescent device to be dried respectively.

For example, the dry box further comprises temperature controllers configured to adjust a temperature of the heating sources, the heating sources configured to heat subpixels emitting light of the same color being coupled to a same temperature controller.

For example, grooves are provided on the substrate, the heating sources are provided in the grooves, respectively, and the dry box further comprises a control member configured to control the heating sources to move up and down in a thickness direction of the substrate.

For example, each temperature controller is an electric heating structure provided with a thermocouple, and the electric heating structures adjusting output currents in real time according to the temperature fed back by the thermocouples.

At least one embodiment also provides a method of controlling a dry box, the dry box comprising a cavity and a hot plate provided in the cavity, the hot plate comprising a plurality of heating spots, the plurality of heating spots being arranged towards the hot plate to support a surface of the device to be dried, and the plurality of heating spots having different temperatures and are insulated from each other, the control method comprising: controlling a heating temperature of each of the plurality of heating spots, such that each pattern to be dried in the device to be dried has a same evaporation rate in the dry box.

For example, the hot plate comprises a substrate and a plurality of independent heating sources provided on the substrate, the substrate being made of a heat insulating material, the control method further comprising: controlling the movement of the heating sources, such that the heating sources moves in a direction away from the substrate.

For example, the heating spots are respectively top portions of the heating sources on the hot plate, or points or regions respectively corresponding to the orthographic projections of the heating sources on the hot plate.

At least one embodiment also provides a method of preparing an organic electroluminescent device, comprising: forming a pattern to be dried of an organic electroluminescent device on a substrate; and placing the substrate on which the pattern to be dried is formed on a hot plate of the dry box in an alignment manner for drying.

For example, the forming the pattern to be dried of the organic electroluminescent device on a substrate comprises: forming a hole injection layer to be dried, a hole transport layer to be dried, and an electroluminescent layer to be dried on the substrate using a solution process.

BRIEF DESCRIPTION OF THE DRAWINGS

The embodiments of the present disclosure will be described in more detail below with reference to the accompanying drawings, such that those skilled in the art understand the embodiments of the present disclosure more clearly, in which.

DETAILED DESCRIPTION

Figure 1:
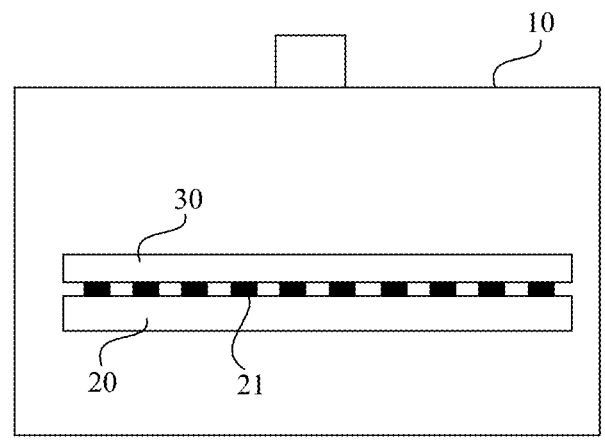
FIG. 1 is a schematically structural diagram of a dry box according to an embodiment of the present disclosure.

Technical solutions of the embodiments will be described in a clearly and fully understandable way in connection with the drawings related to the embodiments of the disclosure. It is apparent that the described embodiments are a part but not all of the embodiments of the disclosure. Based on the described embodiments herein, one of ordinary skill in the art can obtain other embodiment(s), without any creative work, which shall be within the scope of the disclosure.

Unless otherwise defined, all the technical and scientific terms used herein have the same meanings as commonly understood by one of ordinary skill in the art to which the present disclosure belongs. The terms, such as 'first,' 'second,' or the like, which are used in the description and the claims of the present disclosure, are not intended to indicate any sequence, amount or importance, but for distinguishing various components. The terms, such as 'comprise/comprising,' 'include/including,' or the like are intended to specify that the elements or the objects stated before these terms encompass the elements or the objects and equivalents thereof listed after these terms, but not preclude other elements or objects. The terms, 'on,' 'under,' 'inside,' 'outside,' or the like are only used to indicate relative position relationship, and when the absolute position of the object which is described is changed, the relative position relationship may be changed accordingly.

The thin film deposition method for an organic electroluminescent device mainly includes an evaporation process and a solution process. The evaporation process is suitable for small organic molecules, and has good uniformity of film formation and relatively mature technology, but its equipment investment is huge, the material utilization is low, and a mask for a large-sized product has a low alignment accuracy. The solution processes includes spin coating, inkjet printing, nozzle coating, or the like, suitable for polymer materials and small soluble molecules, with the characteristics of low equipment cost and outstanding advantage in mass and large-size production.

The inventor noticed that after formed by the solution process, a liquid organic thin film is dried and then baked. During the drying process, when a plurality of patterns to be dried with different shapes is dried under complete same drying conditions, uneven drying occurs.

For example, when the organic thin film formed by inkjet printing in red, green, and blue subpixel regions is dried in a dry box on the same substrate, due to different sizes of the red, green, and blue subpixel regions, a required drying pressure is not consistent, a volatilization rate is different under the same pressure, and it cannot obtain three good organic films under the same pressure. For example, for forming an electroluminescent layer, due to different sizes of the red, green, and blue subpixel regions, red, green, and blue electroluminescent layers require different vacuum drying conditions. In the mass production, usually, the red, green and blue electroluminescent layers are prepared by a liquid process and then dried in the dry box. When the drying effect of one of the red, green and blue electroluminescent layers is better, the drying effect of the other two of the red, green and blue electroluminescent layer is not ideal. In this way, when the electroluminescent layers are dried under the same vacuum drying condition, the drying effect is inevitably undesirable, such that three electroluminescent layers which are dried evenly cannot be obtained under the same vacuum drying condition. In the present disclosure, different temperatures are applied to the red, green, and blue subpixel regions to solve this problem. Due to the vacuum condition, different temperatures among the red, green, and blue subpixel regions do not cause crosstalk. The temperature control process is related to the size of the pixel region, a specific surface area of the ink, a saturated vapor pressure, a molecular weight of an organic solvent, or the like. An ultimate purpose of controlling the temperature is to enable the organic thin films in the red, green and blue subpixel regions to have the same evaporation rate (Gs) under the same pressure. That is, $Gs_R = Gs_G = Gs_B$.

An embodiment of the present disclosure provides a dry box. As shown in FIG. 1, the dry box includes a cavity 10 and a hot plate 20 provided in the cavity 10. The hot plate 20 includes a plurality of heating spots 21, and the heating spots 21 are arranged towards the surface of the hot plate 20 for supporting the device 30 to be dried. Some of the plurality of heating spots 21 have different temperatures and some of the heating spots 21 have the same temperature, and the heating spots 21 are insulated from each other.

It is to be noted that, for example, the heating spots 21 are arranged towards the surface of the hot plate 20 for supporting the device 30 to be dried. In this way, when the device 30 to be dried is placed on the hot plate 20, the heating spots 21 are brought into direct contact with the device 30 to be dried.

For example, the hot plate 20 includes the plurality of independent heating spots 21.

For example, the temperatures of the plurality of heating spots 21 may not be completely the same, i.e., some are the same and some are different. The temperatures of the plurality of heating spots 21 may be controlled independently, or temperatures of some of the heating spots are controlled synchronously, but the heating spots 21 are insulated from each other, and temperature crosstalk will not occur.

For example, the heating spots 21 may be arranged reasonably according to a usage scenario, or the like.

The principle of improving the uniformity of the device 30 to be dried in the embodiments of the present disclosure is as follows. The factors affecting the evaporation rate of the liquid include: (1) the temperature applied to the liquid; (2) the specific surface area (S/V) of the liquid; (3) an air flow velocity of the liquid surface; (4) the saturated vapor pressure of the solvent; (5) the molecular weight M of the organic solvent. Generally, when films with the same function are prepared by a solution process, the used solvent is the same. That is, the molecular weight M of the organic solvent is the same. The patterns to be dried in the device 30 to be dried (the organic patterns formed in red, green and blue subpixel regions respectively) are in the same dry box, and the air flow velocity in the cavity 10 is the same, but due to different sizes of the patterns to be dried, the specific surface areas S/V (V=4/3πR³, S=4πR²) of the patterns to be dried are different. The saturated vapor pressure of the solvent is related to the applied temperature. Therefore, for the patterns to be dried in the dry box, the factors affecting the drying uniformity are the temperature applied to the liquid and the specific surface area of the liquid. According to the specific surface area of the pattern to be dried, the temperature applied to the pattern to be dried is adjusted to improve the uniformity of the pattern to be dried.

In the mass production, the device 30 to be dried includes a plurality of patterns to be dried with different shapes and sizes. When the device 30 to be dried is placed in the dry box, the drying conditions in the dry box are constant, but under the same drying condition, the evaporation rates of the solvents in different patterns to be dried are different. Due to the evaporation rate of the liquid relating to the temperature applied to the liquid, in the embodiment of the present disclosure, the temperatures of the heating spots 21 on the hot plate 20 are not completely the same, and the temperatures of the heating spots 21 on the hot plate 20 may be controlled independently. In this way, different temperatures are applied to different patterns to be dried of the same device 30 to be dried, such that the evaporation rate of the solvents in the different patterns to be dried is the same, so as to improve the uniformity of the surfaces of the different patterns to be dried.

Figure 2:
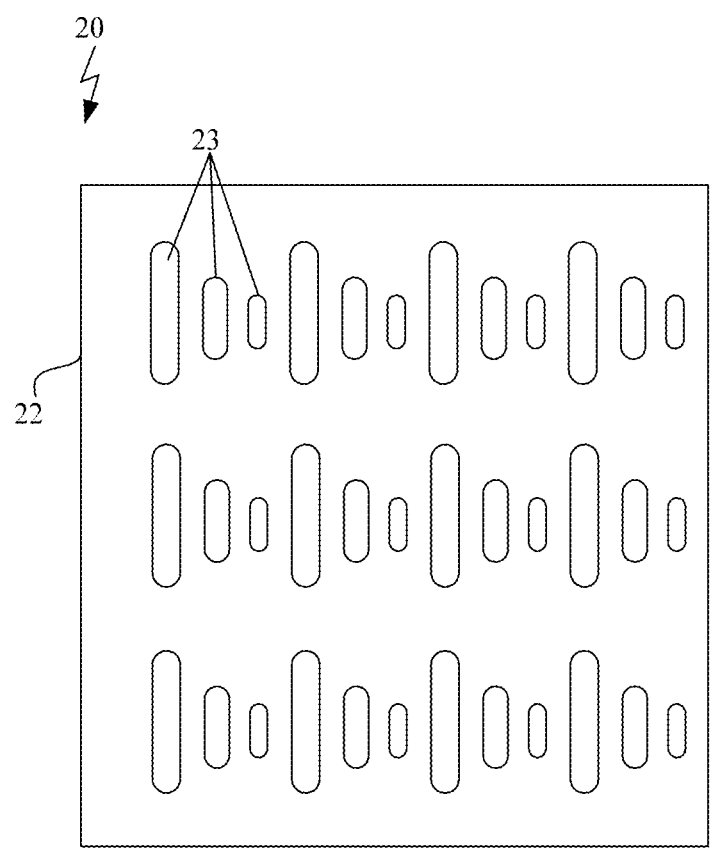
FIG. 2 is a schematically structural diagram of a hot plate according to an embodiment of the present disclosure.

In some embodiments, as shown in FIG. 2, for example, the hot plate 20 includes a substrate 22 and a plurality of independent heating sources 23 arranged on the substrate 22, and the substrate 22 is made of a heat insulating material.

For example, the heating spots 21 are the top portions of the heating sources 23 on the hot plate 20, or the heating spots 21 are points or regions respectively corresponding to orthographic projections of the heating sources 23 on the hot plate 22.

For example, the substrate 22 is made of an existing material with thermal insulation function, and the material of the substrate 22 should be suitable for use in the dry box.

In addition, the heating sources 23 are independent from each other, and the substrate 22 is made of the heat insulating material. In this way, the heating sources 23 are insulated from each other without interfering with each other. For example, the patterns of the plurality of heating sources 23 on the substrate 22 may be the same or different. Those skilled in the art should understand that the heating sources 23 may be in direct contact with the device 30 to be dried. For example, in order to further improve the stability of placing the device 30 to be dried, the surface of each heating source 23 in contact with the device 30 to be dried should be a plane parallel to the substrate 22.

Any manner capable of causing the heating sources 23 to generate thermal energy in the art is applicable to the present disclosure.

In the embodiment of the present disclosure, the heating sources 23 are provided on the insulating substrate 22, and the device 30 to be dried is heated by the heating sources 23. On the one hand, the heating sources 23 and the device 30 to be dried may be supported by the substrate 22 to stabilize the entire drying process, in addition, the problem that the patterns to be dried is prevented due to the lean caused by the instability of the device 30 to be dried.

In some embodiments, as shown in FIG. 2, the shapes of the orthographic projections of the plurality of heating sources 23 on the substrate 22 may not be completely the same, i.e., some of the shapes of the orthographic projections of the plurality of heating sources 23 on the substrate 22 are the same and some are different.

For example, the cross-sectional areas of the plurality of heating sources 23 may not be completely the same, i.e., some of the cross-sectional areas of the plurality of heating sources 23 are the same and some are different.

For example, the adjustment of the temperature applied to the patterns to be dried in combination with the specific surface area of the patterns to be dried may improve the uniformity of the device 30 to be dried. In order to further improve the heat uniformity of the patterns to be dried, the present disclosure adjusts the cross-sectional shapes of the heating sources 23, such that each region of each pattern to be dried is heated simultaneously. In this way, the uniformity of the device 30 to be dried is further improved. The detailed description will be made below.

In some embodiments, the dry box includes a plurality of temperature controllers 40, and each of the temperature controllers 40 is coupled to one or a group of heating sources 23 having the same shape or cross-sectional shape to independently control the temperatures of each heating sources 23, and to increase the scope of application of the dry box.

Figure 3:
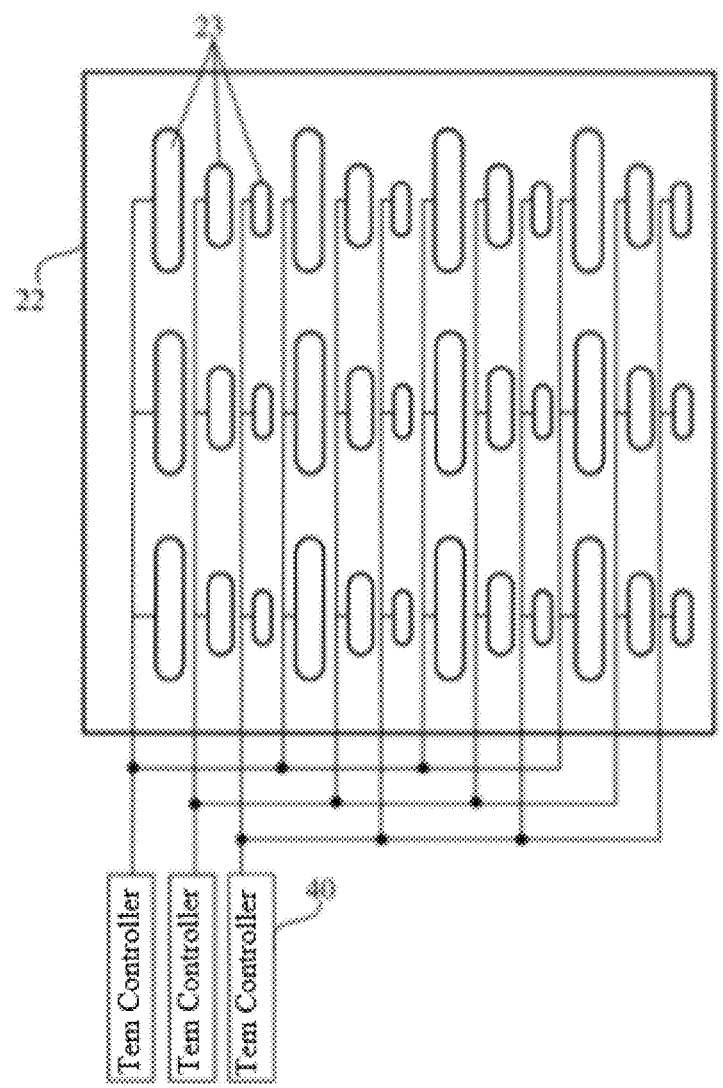
FIG. 3 is a schematic diagram of a correspondence relationship between a heating source and a temperature controller according to an embodiment of the present disclosure.

In some embodiments, as shown in FIG. 3, the dry box includes a plurality of temperature controllers 40, and the heating sources 23 having the same shape of the orthographic projections on the substrate 22 are coupled to the same temperature controller 40.

For example, the heating sources 23 with the same orthographic shape on the substrate 22 usually heat the patterns to be dried with the same shape, and the required output heating temperatures are the same. In this way, the heating sources 23 with the same orthographic shape on the substrate 22 are controlled by the same temperature controller 40, the count of the temperature controllers 40 may be saved, and the configuration of the dry box is simplified.

Figure 4:
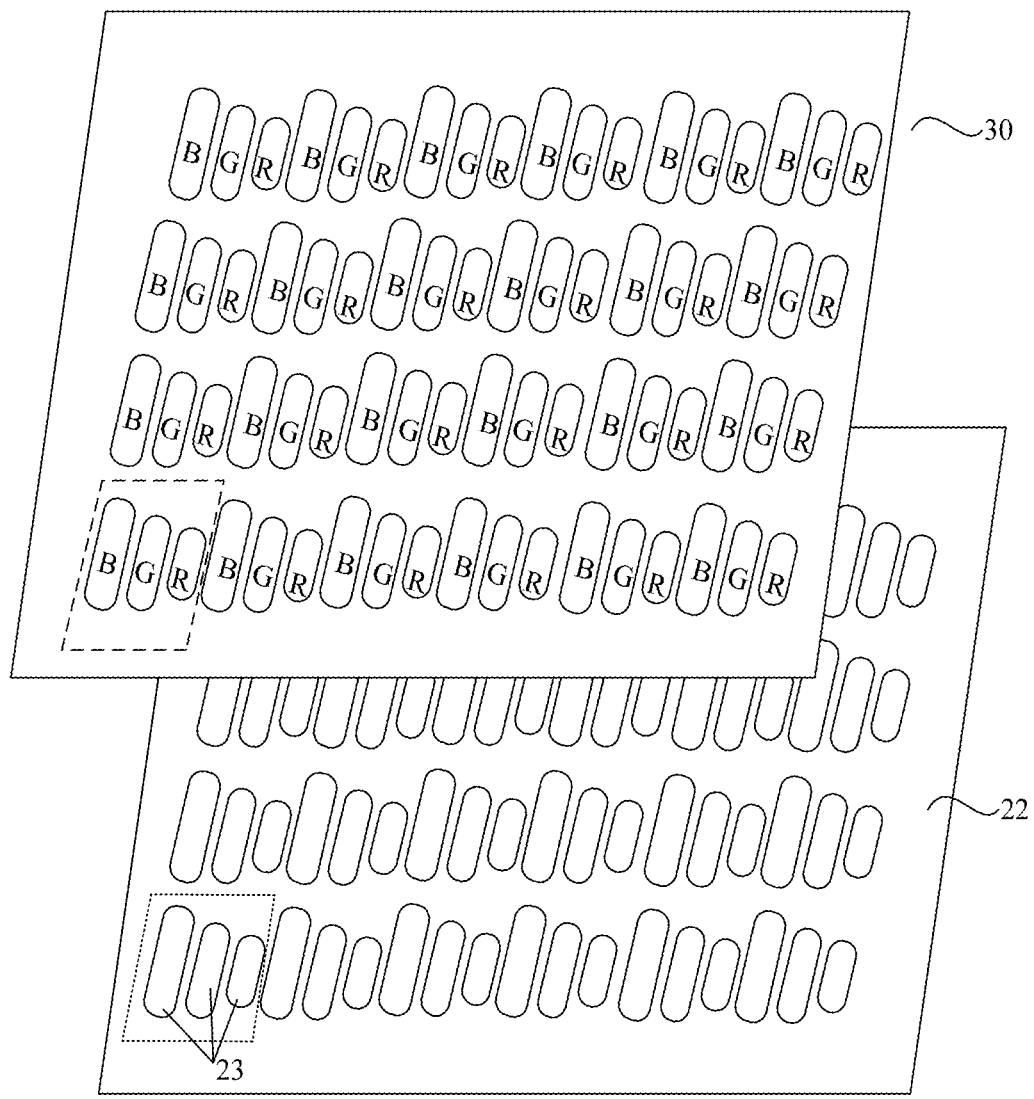
FIG. 4 is a schematic diagram of a correspondence relationship between a shape of the heating source and a shape of a pattern to be dried according to an embodiment of the present disclosure.

In some embodiments, as shown in FIG. 4, the dry box is configured to dry the organic electroluminescent device. The plurality of heating sources 23 on the substrate 22 are divided into a plurality of groups, and the cross-sectional shapes of the plurality of heating sources 23 in each group perpendicular to the thickness direction of the substrate 22 are the same as the shape of the patterns to be dried in a plurality of subpixels in each pixel unit of the organic electroluminescent device to be dried.

Exemplarily, as shown in FIG. 4, each pixel unit includes red, green, and blue subpixels (three subpixels in a dotted box). For the organic electroluminescent device to be dried, the pattern to be dried in the red subpixel is a red electroluminescent layer R, the pattern to be dried in the green subpixel is a green electroluminescent layer G, and the pattern to be dried in the blue subpixel is a blue electroluminescent layer B. Correspondingly, three heating sources 23 on the substrate 22 constitute a group (three heating sources 23 in a dot dashed line box), and three heating sources 23 in each group are configured to heat three patterns to be dried of the red electroluminescent layer R, the green electroluminescent layer G, and the blue electroluminescent layer B respectively; the cross-sectional shape of the heating source 23 for heating the red electroluminescent layer R is the same as the shape of the red electroluminescent layer R, the cross-sectional shape of the heating source 23 for heating the green electroluminescent layer G is the same as that of the green electroluminescent layer G, and the cross-sectional shape of the heating source 23 for heating the blue electroluminescent layer B is the same as that of the blue electroluminescent layer B.

Figure 5:
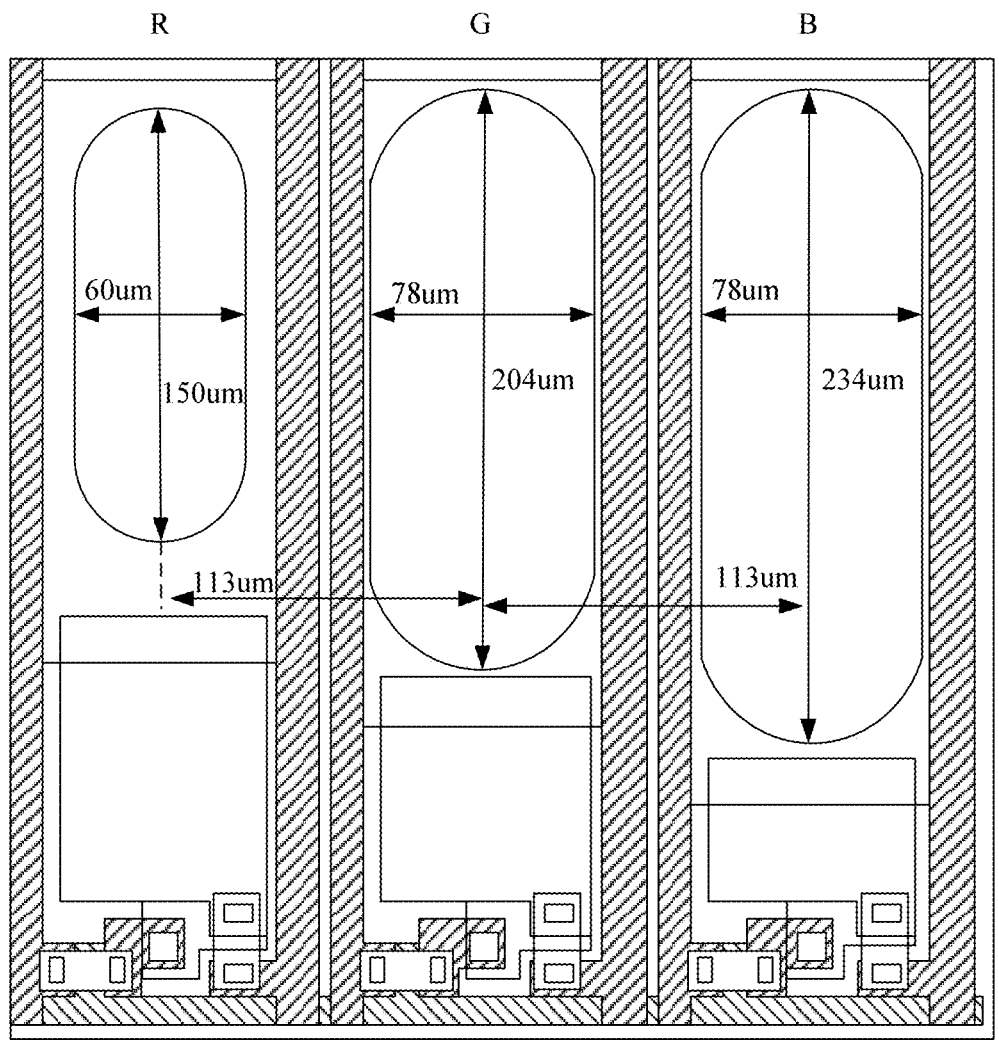
FIG. 5 is a schematically structural diagram of a device to be dried according to an embodiment of the present disclosure.

Exemplarily, as shown in FIG. 5, a 60 μm×150 μm red electroluminescent layer R, a 78 μm×204 μm green electroluminescent layer G, and a 78 μm×234 μm blue electroluminescent layer B are formed by inkjet printing simultaneously. Correspondingly, the device after inkjet printing is placed in the dry box to be dried, the heating sources 23 act on open areas in the subpixels, and according to a mark on the hot plate 20, different colors of subpixels correspond to the heating sources 23 of different temperatures respectively, and the heating sources 23 corresponding to the red, green and blue subpixels respectively have different temperatures and cross-sectional areas. For example, the temperatures of the heating sources 23 are adjusted according to the volatilization rates of the solvents in the red electroluminescent layer R, the green electroluminescent layer G, and the blue electroluminescent layer B; the cross-sectional area of each heating source 23 for heating the red electroluminescent layer R is 60 μm×150 μm, the cross-sectional area of each heating source 23 for heating the green electroluminescent layer G is 78 μm×204 μm, and the cross-sectional area of each heating source 23 for heating the blue electroluminescent layer B is 78 μm×234 μm. That is, the contact areas of the heating sources 23 and the device 30 to be dried are respectively the same as the opening size of each of the red, green, and blue subpixels in the opening regions (the opening regions are configured to inkjet print the organic thin film), so that the red electroluminescent layer R, the green electroluminescent layer G, and the blue electroluminescent layer B can be dried simultaneously.

The heating sources 23 directly act on the opening regions of the subpixels, respectively. Due to the heating sources 23 heating the device 30 to be dried in the vacuum cavity 10, and no air presents as a transmission medium, the temperatures among each other cannot cause crosstalk.

Or, the heating sources 23 are not in direct contact with the opening regions of the pixels. For example, the heating sources 23 may have a distance of, for example, less than about 10 nm from the opening regions, and the pixels are heated using the principle of thermal radiation in a vacuum environment.

For the patterns to be dried in the dry box, the factors affecting the drying uniformity include the temperature applied to the liquid, the saturated vapor pressure of the solvent, and the specific surface area of the liquid. For example, for the structure in FIG. 5, $S_R/V_R \neq S_G/V_G \neq S_B/V_B$.

With respect to the determination of the heating temperature of each heating source 23: according to Mazak's formula, the evaporation rate of an organic liquid is $Gs=(5.38+4.1u)P_vFM^{1/2}$, where Gs is an evaporation amount of the organic solvent, u is the air flow rate in the environment of the hollow dry box, $P_v$ is the saturated vapor pressure of the organic solvent, F is the specific surface area (that is, the surface area to volume ratio S/V) at which the organic solvent is volatile, and M is the molecular weight of the organic solvent. Therefore, the evaporation rate is related to the saturated vapor pressure, and in turn, the saturated vapor pressure is related to the applied temperature. According to the Antoine formula, $\ln(P_v)=9.3876-3826.36/(T-45.47)$ (T is between 290K and 500K), and the relationship between the saturated vapor pressure and the temperature is obtained, $P_v=e^{9.3876-3826.36/(T-45.47)}$.

The evaporation rate is $Gs=(5.38+4.1u)e^{9.3876-3826.36/(T-45.47)}FM^{1/2}$. In a same dry box, the red electroluminescent layer R, the green electroluminescent layer G, and the blue electroluminescent layer B are dried simultaneously, that is, the evaporation rates of the three are equal, i.e., $Gs_R=Gs_G=Gs_B$, that is: $(5.38+4.1u)e^{9.3876-3826.36/(T_R-45.47)}F_RM^{1/2}=(5.38+4.1u)e^{9.3876-3826.36/(T_G-45.47)}F_GM^{1/2}=(5.38+4.1u)e^{9.3876-3826.36/(T_B-45.47)}F_BM^{1/2}$, i.e., $e^{9.3876-3826.36/(T_R-45.47)}F_R=e^{9.3876-3826.36/(T_G-45.47)}F_G=e^{9.3876-3826.36/(T_B-45.47)}F_B$, where F is the specific surface area S/V of the pattern to be dried.

For example, the solvent commonly used in inkjet printing is anisole. If the heating temperature of the red electroluminescent layer R is fixed at 20° C. and the saturated vapor pressure corresponding to the anisole is 0.257, the specific surface areas of ink of the red electroluminescent layer R, the green electroluminescent layer G and the blue electroluminescent layer B are calculated respectively. The proportional distribution may be performed according to the temperatures and specific surface areas of the green electroluminescent layer G and the blue electroluminescent layer B, and the heating temperatures of the green electroluminescent layer G and the blue electroluminescent layer B can be calculated based on the above-mentioned formula.

In the following, Table 1 is the specific surface area corresponding to the common droplet volume and droplet radius. Table 2 is the saturated vapor pressure of some solvents often used in inkjet printing at different temperatures.

TABLE 1

Specific surface areas corresponding to the common droplet volumes and droplet radii

| Ink Droplet Volume V/pl | Ink Droplet Radius R/um | Specific Surface Area S/V mm$^{-1}$ |
|---|---|---|
| 1 | 6.203504909 | 483597586.2 |
| 5 | 10.60784418 | 56561916.81 |
| 10 | 13.36504618 | 22446611.56 |
| 15 | 15.29915871 | 13072614.24 |

TABLE 2

Relationship between the Solvent Temperature and the Saturated Vapor Pressure

|  | 10□ | 15□ | 20□ | 23□ | 25□ | 30□ | 40□ | 50□ | 100□ |
|---|---|---|---|---|---|---|---|---|---|
| Water | 1.2281 | 1.7056 | 2.3388 | 2.8104 | 3.169 | 4.2455 | 7.3814 | 12.344 | 100 |
| Ethylene glycol |  |  | 0.008 | 0.01 | 0.012 | 0.017 | 0.034 | 0.065 | 2.169 |
| Anisole |  |  | 0.257 | 0.312 | 0.354 | 0.483 | 0.873 | 1.52 |  |
| Glycerol |  |  | 0.001 | 0.001 | 0.001 | 0.002 | 0.003 |  |  |
| Diethylene glycol butyl ether |  |  | 0.008 | 0.01 | 0.012 | 0.017 | 0.034 | 0.066 | 1.1 |
| Diethylene glycol monomethyl ether |  | 0.122 | 0.17 | 0.209 | 0.238 | 0.327 | 0.597 |  |  |
| N-butylbenzene |  | 4.70E-02 | 0.067 | 0.082 | 0.094 | 0.131 | 0.247 |  |  |
| Diphenyl ether |  |  | 0.003 | 0.003 | 0.004 | 0.005 | 0.011 | 0.023 |  |
| Phenylcyclohexane |  |  | 0.006 | 0.007 | 0.008 | 0.012 | 0.024 | 0.047 |  |

TABLE 2-continued

Relationship between the Solvent Temperature and the Saturated Vapor Pressure

|  | 10□ | 15□ | 20□ | 23□ | 25□ | 30□ | 40□ | 50□ | 100□ |
|---|---|---|---|---|---|---|---|---|---|
| Phenetole |  |  | 0.131 | 0.16 | 0.182 | 0.252 | 0.464 | 0.824 |  |
| Isopropanol |  |  | 5.9 | 7 | 7.8 | 10.1 | 16.5 | 26.4 |  |

Figure 6:
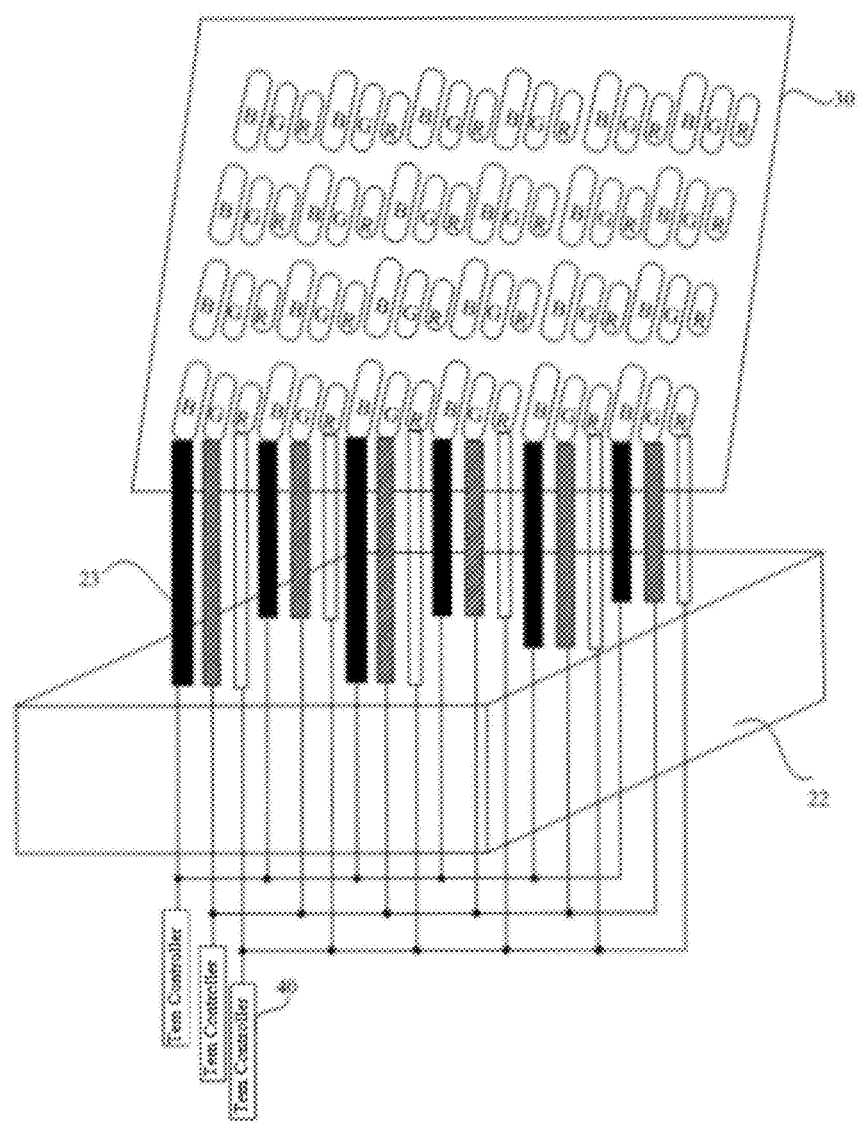
FIG. 6 is a schematically structural diagram of the hot plate and the temperature controller according to an embodiment of the present disclosure.

In some embodiments, due to the specific surface areas of the patterns to be dried in the subpixels emitting light of the same color are the same, the heating sources 23 for heating the subpixels emitting light of the same color also have the same temperature. Based on this, as shown in FIG. 6, the dry box according to the embodiment of the present disclosure further includes temperature controllers 40 for adjusting the temperatures of the heating sources 23. For example, the heating sources 23 that heat subpixels emitting light of the same color are coupled to a same temperature controller 40.

That is, the plurality of heating sources 23 that heat the red electroluminescent layer R are coupled to a same temperature controller 40, the plurality of heating sources 23 that heat the green electroluminescent layer G are coupled to a same temperature controller 40, and the plurality of heating sources 23 that heat the blue electroluminescent layer B are coupled to the same temperature controller 40.

The temperature adjustment of the heating sources 23 by the temperature controllers 40 is based on the specific surface areas of the patterns to be dried corresponding to the heating sources 23, and the temperature of each heating source 23 is determined with reference to the above principle. Here, the specific surface area of each pattern to be dried can be input to a temperature controller 40, the temperature controller 40 calculates the heating temperature, or other components calculate the heating temperature, and the temperature controller 40 controls the heating temperature according to the calculation result. Other ways may be used.

Figure 7:
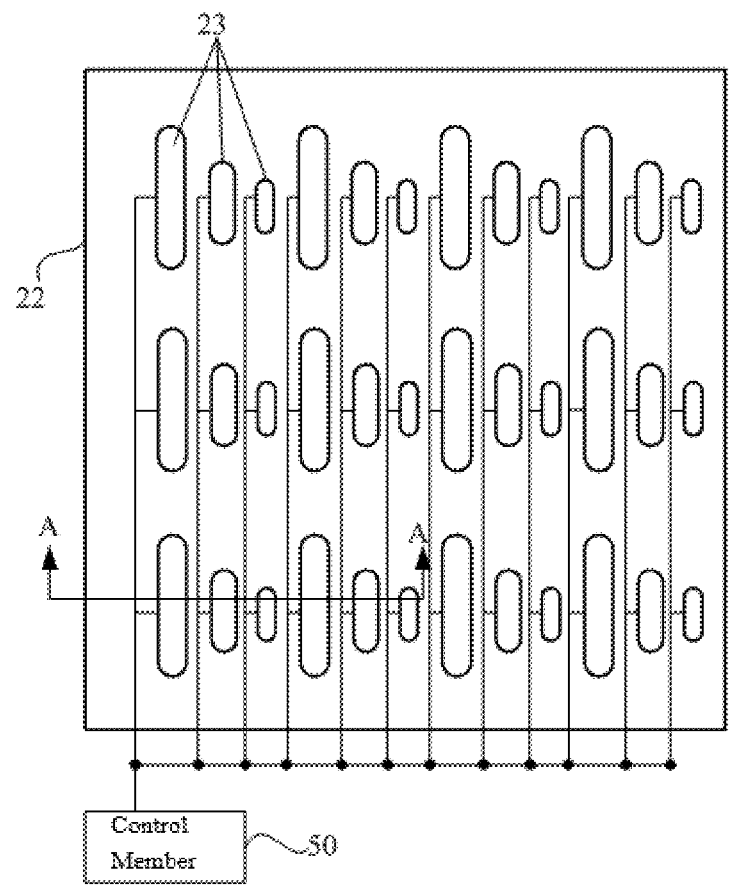
FIG. 7 is a schematically structural diagram of the heating source and a substrate according to an embodiment of the present disclosure.
Figure 8:
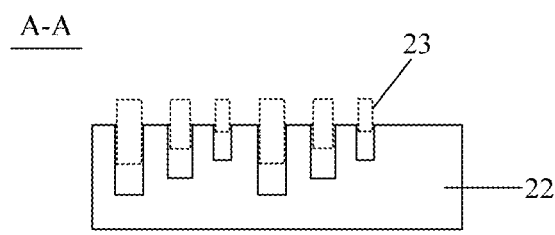
FIG. 8 is a sectional view taken along A-A direction in FIG. 7.

In some embodiments, in order to further avoid temperature crosstalk between the heating sources 23, for example, as shown in FIGS. 7 and 8, grooves are disposed on the substrate 22, the heating sources 23 are disposed in the grooves, respectively, and the dry box further includes a control member 50. The control member 50 is configured to control the heating sources 23 to move up and down in the thickness direction of the substrate 22.

The shapes of the grooves allow the heating sources to be placed therein. That is, the orthographic projections of the grooves on the substrate 22 cover the orthographic projections of the heating sources 23 corresponding to the grooves on the substrate 22. In some embodiments, the depth of each groove is greater than the length of a corresponding heating source 23 in the thickness direction of the substrate 22.

During the drying process, the control member 50 is raised to control the heating sources 23 to move away from the substrate 22 (the dotted line as shown in FIG. 8), such that the heating sources 23 support the device 30 to be dried. After the heating is completed, the control member 50 controls the heating sources 23 to move in a direction towards the substrate 22, such that the heating sources 23 are placed inside the substrate 22.

For example, in some embodiments, in order to accurately control the temperatures of the heating sources 23 in real time, each temperature controller (Tem Controller) 40 is, for example, an electric heating structure provided with a thermocouple, and the electric heating structure adjusts the output current in real time according to the temperature fed back by the thermocouple.

The temperature control principle of the heating sources 23 is explained below. The pixel units are heated by applying an external current, and a closed-loop system is formed by the thermocouple feedback temperature to regulate the output currents of the heating sources 23 in real time, for example, the value of the temperature is adjusted using a proportion integral differential coefficient (PID), so as to control different patterns to be heated at different temperatures.

Although the description is made with the case where the pixel unit includes red, green and blue subpixels in the above, the embodiments of the present disclosure are not limited thereto. For example, the pixel unit may further include subpixel units of other colors. In this way, the corresponding heating source group also includes the corresponding heating sources 23 and the corresponding heating spots.

An embodiment of the present disclosure also provides a control method of a dry box, including: controlling a heating temperature of each heating spot 21, such that each pattern to be dried in the device 30 to be dried has a same evaporation rate in the dry box.

Other drying conditions in the dry box are not changed, and the heating temperatures of the heating spots 21 are not completely the same. That is, some of the heating temperatures are the same, and some are different. The method of obtaining the heating temperature of the heating spot 21 corresponding to each pattern to be dried is as described above.

In the method of controlling a dry box according to the embodiment of the present disclosure, during the drying process, different temperatures are applied to different patterns to be dried of the same device 30 to be dried, such that the solvents in different patterns to be dried have the same evaporation rate, so as to improve the surface uniformity of different patterns to be dried.

In some embodiments, the control method further includes: controlling the heating sources 23 to move, such that the heating sources 23 move in a direction away from the substrate 22.

That is, the heating sources 23 are controlled to be raised, such that a given distance presents between the device 30 to be dried and the substrate 22. For example, the heating sources 23 may be raised after the device 30 to be dried is placed in the dry box, or the heating sources 23 may be raised before the device 30 to be dried is placed in the dry box.

An embodiment of the present disclosure also provides a method of preparing an organic electroluminescent device, including following operations.

S10, forming a pattern to be dried of an organic electroluminescent device on a substrate.

The pattern to be dried is formed from a solution obtained by dissolving an organic material in a solvent. At this point, the pattern to be dried is in a liquid state. The formation of the pattern to be dried on the substrate may be to form a hole injection layer to be dried or a hole transport layer to be dried or an electroluminescent layer to be dried, or the like, on the substrate using the solution process.

For example, for the formation of the electroluminescent layer, the red electroluminescent layer to be dried formed in the red subpixel, the green electroluminescent layer to be dried formed in the green subpixel, and the blue electroluminescent layer to be dried formed in the blue subpixel have patterns which are not completely the same.

S20, placing the substrate on which the pattern to be dried is formed on the hot plate 20 of the above-mentioned dry box in an alignment manner for drying.

For example, during the drying process, the dry box controls the temperature of each heating spot 21 corresponding to the electroluminescent layer pattern of each color according to different heating temperatures required for the electroluminescent layer pattern of each color, such that each region of the liquid organic film layer may be dried relatively uniformly, and the yield of the organic electroluminescent device is improved.

The embodiments of the present disclosure provide a dry box, a control method thereof, and a method of preparing an organic electroluminescent device. Due to the evaporation rate of a liquid being related to the temperature applied to the liquid, in the embodiments of the present disclosure, by setting the temperatures of the heating spots on the hot plate not completely the same, the temperatures of the heating spots on the hot plate can be controlled independently. In this way, different temperatures are applied to different patterns to be dried of the same device to be dried, such that the evaporation rates of the solvents in different patterns to be dried are the same to improve the surface uniformity of different patterns to be dried.

The following statements should be noted.

(1) The accompanying drawings involve only the structure(s) in connection with the embodiment(s) of the present disclosure, and other structure(s) can be referred to common design(s).

(2) Without conflicting with each other, the embodiments of the present disclosure and elements in the embodiments can be combined.

The description above is only exemplary embodiments of the present disclosure, and the scope of the present disclosure is not limited thereto. Any changes or substitutions readily conceived by one of ordinary skill in the art without departing the technical scope of the present embodiments, shall fall within the scope of the present disclosure.

What is claimed is:

1. A dry box, comprising a cavity and a hot plate provided in the cavity,
    wherein the hot plate comprises a plurality of heating spots, the plurality of heating spots being arranged towards the hot plate to support a surface of a device to be dried, and some of temperatures of the plurality of heating spots being different from each other and the heating spots being insulated from each other;
    wherein the hot plate comprises a substrate and a plurality of independent heating sources arranged in array on the substrate, the substrate being made of a heat insulating material; and
    the heating spots are respectively top portions of the heating sources on the hot plate, or points or regions respectively corresponding to orthographic projections of the heating sources on the hot plate.

2. The dry box according to claim 1, wherein some of shapes of the orthographic projections of the plurality of heating sources on the substrate are different.

3. The dry box according to claim 1, further comprising temperature controllers configured to adjust temperatures of the heating sources,
    each of the temperature controllers being coupled to a corresponding heating source,
    or,
    the heating sources having a same shape of orthographic projections on the substrate being coupled to a same temperature controller.

4. The dry box according to claim 1, wherein the dry box is configured to dry an organic electroluminescent device to be dried, and the plurality of heating sources on the substrate are divided into a plurality of groups, a cross-sectional shape of the plurality of the heating sources in each group perpendicular to a thickness direction of the substrate is same as a shape of a pattern to be dried in a plurality of subpixels in each pixel unit of the organic electroluminescent device to be dried respectively.

5. The dry box according to claim 4, further comprising temperature controllers configured to adjust a temperature of the heating sources, the heating sources configured to heat subpixels emitting light of a same color being coupled to the same temperature controller.

6. The dry box according to claim 1, wherein grooves are provided on the substrate, the heating sources are provided in the grooves, respectively, and the dry box further comprises a control member configured to control the heating sources to move up and down in a thickness direction of the substrate.

7. The dry box according to claim 3, wherein each temperature controller is an electric heating structure provided with a thermocouple, each electric heating structures adjust outputting currents in real time according to a temperature fed back by a corresponding thermocouples.

8. A method of controlling a dry box, the dry box comprising a cavity and a hot plate provided in the cavity, wherein the hot plate comprising a plurality of heating spots, the plurality of heating spots being arranged towards the hot plate to support a surface of the device to be dried, and the plurality of heating spots having different temperatures from each other and are insulated from each other, the hot plate comprises a substrate and a plurality of independent heating sources arranged in array on the substrate, the substrate being made of a heat insulating material, and the heating spots are respectively top portions of the heating sources on the hot plate, or points or regions respectively corresponding to orthographic projections of the heating sources on the hot plate; the control method comprising:
    controlling a heating temperature of each of the plurality of heating spots, such that each pattern to be dried in the device to be dried has a same evaporation rate in the dry box; and
    controlling the movement of the heating sources, such that the heating sources moves in a direction away from the substrate.

9. A method of preparing an organic electroluminescent device by using a dry box, wherein the dry box comprises a cavity and a hot plate provided in the cavity, wherein the hot plate comprises a plurality of heating spots, the plurality of heating spots being arranged towards the hot plate to support a surface of a device to be dried, and some of the temperatures of the plurality of heating spots being different from each other and the heating spots being insulated from each other; the hot plate comprises a substrate and a plurality of independent heating sources arranged in array on the substrate, the substrate being made of a heat insulating material; and the heating spots are respectively top portions of the heating sources on the hot plate, or points or regions respectively corresponding to orthographic projections of the heating sources on the hot plate; wherein the method comprises:

provinding a substrate;

forming a pattern to be dried of the organic electroluminescent device on the substrate; and placing the substrate on which the pattern to be dried is formed on the hot plate of the dry box in an alignment manner for drying.

10. The method according to claim 9, wherein the forming the pattern to be dried of the organic electroluminescent device on the substrate comprises:

forming a hole injection layer to be dried, a hole transport layer to be dried, and an electroluminescent layer to be dried on the substrate using a solution process.

11. The dry box according to claim 1, further comprising temperature controllers configured to adjust temperatures of the heating sources, each of the temperature controllers being coupled to a corresponding heating source, or, the heating sources having a same shape of orthographic projections on the substrate being coupled to a same temperature controller.

12. The dry box according to claim 11, wherein the dry box is configured to dry an organic electroluminescent device to be dried, and the plurality of heating sources on the substrate are divided into a plurality of groups, a cross-sectional shape of the plurality of the heating sources in each group perpendicular to a thickness direction of the substrate is same as a shape of a pattern to be dried in a plurality of subpixels in each pixel unit of the organic electroluminescent device to be dried respectively.

13. The dry box according to claim 12, further comprising temperature controllers configured to adjust a temperature of the heating sources, the heating sources configured to heat subpixels emitting light of a same color being coupled to a same temperature controller.

14. The dry box according to claim 13, wherein grooves are provided on the substrate, the heating sources are provided in the grooves, respectively, and the dry box further comprises a control member configured to control the heating sources to move up and down in a thickness direction of the substrate.

15. The dry box according to claim 14, wherein each temperature controller is an electric heating structure provided with a thermocouple, each electric heating structures adjust outputting currents in real time according to a temperature fed back by a corresponding thermocouple.

* * * * *